(12) United States Patent
Sershen et al.

(10) Patent No.: US 10,844,488 B2
(45) Date of Patent: Nov. 24, 2020

(54) CHUCK SYSTEMS AND METHODS HAVING ENHANCED ELECTRICAL ISOLATION FOR SUBSTRATE-BIASED ALD

(71) Applicant: Veeco Instruments Inc., Plainview, NY (US)

(72) Inventors: Michael J. Sershen, Cambridge, MA (US); Adam Bertuch, South Hamilton, MA (US)

(73) Assignee: Veeco Instruments Inc., Plainview, NY (US)

( * ) Notice: Subject to any disclaimer, the term of this patent is extended or adjusted under 35 U.S.C. 154(b) by 341 days.

(21) Appl. No.: 15/877,809

(22) Filed: Jan. 23, 2018

(65) Prior Publication Data

US 2018/0216229 A1    Aug. 2, 2018

Related U.S. Application Data

(60) Provisional application No. 62/451,377, filed on Jan. 27, 2017.

(51) Int. Cl.
| | | |
|---|---|---|
| *C23C 16/455* | (2006.01) | |
| *H01L 21/683* | (2006.01) | |
| *C23C 16/458* | (2006.01) | |
| *B33Y 10/00* | (2015.01) | |
| *H01L 21/285* | (2006.01) | |

(52) U.S. Cl.
CPC ........ *C23C 16/45553* (2013.01); *B33Y 10/00* (2014.12); *C23C 16/458* (2013.01);
(Continued)

(58) Field of Classification Search
CPC .............. C23C 16/34; C23C 16/45525; C23C 16/4544; C23C 16/45553; C23C 16/4586; H01L 21/6833
(Continued)

(56) References Cited

U.S. PATENT DOCUMENTS 5,634,266 A * 6/1997 Sherstinsky ........ C23C 16/4586
  29/825
5,969,934 A * 10/1999 Larsen ................... H02N 13/00
  361/234
(Continued)

FOREIGN PATENT DOCUMENTS

JP    2006332204 A    12/2006
JP    2009238949 A    10/2009
(Continued)

OTHER PUBLICATIONS

Profijt, H.B., et al., Substrate Biasing During Plasma-Assisted ALD for Crystalline Phase-Control of TiO2 Thin Films. Electromechanical and Solid-State Letters, Jan. 1, 2012.
(Continued)

*Primary Examiner* — Elizabeth A Burkhart
(74) *Attorney, Agent, or Firm* — Downs Rachlin Martin PLLC

(57) ABSTRACT

A chuck system for performing a substrate-biased atomic layer deposition process that forms an electrically conductive film on a substrate includes an electrically conductive substrate holder configured to support the substrate and an electrically conductive base that supports the substrate holder. An electrical isolating layer is sandwiched between the substrate holder and the base. The electrical isolating layer has an outer end and an edge recess formed in and that runs around the outer edge. The edge recess is configured to prevent the electrically conductive film from coating the entire interior of the edge recess, thereby maintaining electrical isolation between the substrate holder and the base.

15 Claims, 11 Drawing Sheets

(52) U.S. Cl.
CPC .... *C23C 16/4583* (2013.01); *C23C 16/45544* (2013.01); *H01L 21/28568* (2013.01); *H01L 21/6833* (2013.01)

(58) Field of Classification Search
USPC .......................................................... 118/728
See application file for complete search history.

(56) References Cited

U.S. PATENT DOCUMENTS

| | | | |
|---|---|---|---|
| 7,871,676 | B2 | 1/2011 | Chiang et al. |
| 8,163,087 | B2 | 4/2012 | Faguet et al. |
| 8,425,987 | B2 | 4/2013 | Dominguez et al. |
| 9,583,371 | B2 | 2/2017 | Shim et al. |
| 2006/0213439 | A1 | 9/2006 | Ishizaka |
| 2009/0197402 | A1 | 8/2009 | Nakashima et al. |
| 2009/0243235 | A1 | 10/2009 | Nobori et al. |
| 2015/0170951 | A1* | 6/2015 | Shim ................ H01J 37/32009 156/345.29 |
| 2016/0012920 | A1 | 1/2016 | Yamashiro et al. |
| 2016/0336210 | A1 | 11/2016 | Cooke et al. |
| 2016/0379806 | A1* | 12/2016 | Xu ..................... H01J 37/32513 156/280 |

FOREIGN PATENT DOCUMENTS

| | | |
|---|---|---|
| JP | 2010171083 A | 8/2010 |
| KR | 20140078193 A | 6/2014 |

OTHER PUBLICATIONS

International Search Report and Written Opinion dated Sep. 18, 2017, in International Application No. PCT/US2017/037007 filed Jun. 12, 2017.

Extended Search Report issued in corresponding Eu Patent Application No. 18744126.6 dated Sep. 28, 2020.

S.B.S. Heil et al., "Low-Temperature Deposition of Tin by Plasma-Assisted Atomic Layer Deposition." Journal of the Electrochemical Society, vol. 153, No. 11 (Jan. 27, 2006).

Rossnagel, S.M. et al., "Plasma-Enhanced Atomic Layer Deposition of Ta and Ti for Interconnect Diffusion Barriers." Journal of Vacuum Science & Technology B: Microelectronics Processing and Phenomena, vol. 18, No. 4, pp. 2016-2020 (Jul. 1, 2000).

Kim, H., "Atomic Layer Deposition of Metal and Nitride Thin Films: Current Research Efforts and Applications for Semiconductor Device Processing." Journal of Vacuum Science and Technology: Part B, vol. 21, No. 6, pp. 2231-2261 (Nov. 1, 2003).

* cited by examiner

CHUCK SYSTEMS AND METHODS HAVING ENHANCED ELECTRICAL ISOLATION FOR SUBSTRATE-BIASED ALD

RELATED APPLICATION DATA

This application claims the benefit of priority of U.S. Provisional Patent Application Ser. No. 62/451,377, filed on Jan. 27, 2017, and titled "CHUCK SYSTEMS AND METHODS WITH ENHANCED ELECTRICAL ISOLATION FOR SUBSTRATE-BIASED ALD", which is incorporated by reference herein in its entirety.

FIELD

The present disclosure relates to atomic layer deposition (ALD), and in particular relates to chuck systems and methods having enhanced electrical isolation for substrate-biased ALD.

BACKGROUND

Atomic Layer Deposition (ALD) is a thin film deposition technique that sequentially exposes a substrate with multiple, distinct chemical and/or energetic environments to form a film on the substrate surface. An overview of the ALD process is presented in the article by George, entitled "Atomic Layer Deposition: An Overview," Chem. Rev. 2010, 110, pp 111-113 (published on the Web on Nov. 20, 2009) and incorporated by reference herein. The ALD process is also described in U.S. Pat. No. 7,128,787, which is incorporated by reference herein. Example ALD systems are disclosed in U.S. Patent Application Publication No. US2006/0021573, U.S. Pat. No. 8,202,575, and PCT Publication No. WO 2015/080979, which are incorporated by reference herein.

A typical ALD process involves supporting a substrate on a chuck within a reactor chamber. The ALD process includes pulling a vacuum in the reactor chamber and then introducing a precursor gas that in an example includes a metal. The metal is chemisorbed with the preexisting chemical moieties on the substrate surface. A purge cycle (e.g., with an inert gas) is then used to remove excess precursor gas and reaction products. A second precursor is then introduced into the reactor, wherein the second precursor is reactive with the chemisorbed portion of the first reactant. A second purge cycle removes excess second precursor gas and reaction products. This process is repeated to slowly build the film layer by layer on the substrate surface. The ALD process can be controlled to sub-atomic layer thickness.

The ALD process is highly conformal, meaning that the film layer closely follows the topography of the substrate surface. This is important property in many applications such as semiconductor manufacturing, wherein the substrate can have a substantial variation in topography, including high-aspect-ratio trenches.

The ALD process can be used to deposit different types of conductive films. The deposition process for a given conductive film can be modified by biasing the substrate with an RF voltage, e.g., by increasing the rate of deposition. This biasing is typically performed by using a conductive substrate holder that supports the substrate in the reactor chamber and providing the substrate holder with a bias voltage. The conductive substrate holder needs to be electrically isolated from the main body of the chuck, which along with the reactor chamber, is grounded. This is accomplished using an electrical insulation layer.

Unfortunately, the conductive film can deposit on the sides of the substrate holder and the electrical insulation layer to create a short between the conductive substrate holder and the main body of the chuck.

SUMMARY

An aspect of the disclosure is a chuck system for performing a substrate-biased atomic layer deposition (ALD) process that forms an electrically conductive film on a substrate. The chuck system includes: an electrically conductive substrate holder configured to support the substrate; an electrically conductive base; and an electrical isolating layer sandwiched between the electrically conductive substrate holder and the electrically conductive base and having an outer edge, with at least one edge recess formed in the outer edge and that runs around the outer edge, the at least one edge recess having an interior and being sized to prevent the electrically conductive film from coating the entire interior of the at least one edge recess during the substrate-biased ALD process.

Another aspect of the disclosure is an ALD system that includes the chuck system as described immediately above and further including a reactor chamber having an interior, wherein the chuck system is arranged in the reactor chamber interior.

Another aspect of the disclosure is an electrical isolation layer for a chuck system used to perform a substrate-biased ALD process to deposit a conducting film. The electrical isolation layer includes: a monolithic disc made of a single electrically insulating material, the disc having an outer edge and having a thickness TH defined by the range 0.1" (2.5 mm)≤TH≤0.5" (12.7 mm); and a recess formed in and that runs around the outer edge, the recess having a height dimension h in the range from 0.01" (0.25 mm)≤h≤0.05" (1.27 mm) and a depth dimension d in the range from 0.20" (5.1 mm)≤d≤4" (101.6 mm), subject to the condition that d/h is in the range 20≤d/h≤100.

Another aspect of the disclosure is an electrical isolation layer for a chuck system used to perform a substrate-biased ALD process to deposit a conducting film. The electrical isolation layer includes: an upper piece made of either an electrically insulating material or an electrically conductive material; a lower piece made of either an electrically insulating material or an electrically conductive material; and a middle piece made of an electrically insulating material and sandwiched between the upper and lower pieces to define a layered structure having an outer edge, wherein the middle piece is sized to define an edge recess in the outer edge and that runs around the outer edge; and wherein the edge recess has a height dimension h in the range from 0.01" (0.25 mm)≤h≤0.05" (1.27 mm) and a depth dimension d in the range from 0.20" (5.1 mm)≤d≤4" (101.6 mm), subject to the condition that d/h is in the range 20≤d/h≤100

Additional features and advantages are set forth in the Detailed Description that follows, and in part will be apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description explain the principles and the operation of the various embodiments. As such, the disclosure will become more fully understood from the following Detailed Description, taken in conjunction with the accompanying Figures, in which.

DETAILED DESCRIPTION

Figure 1:
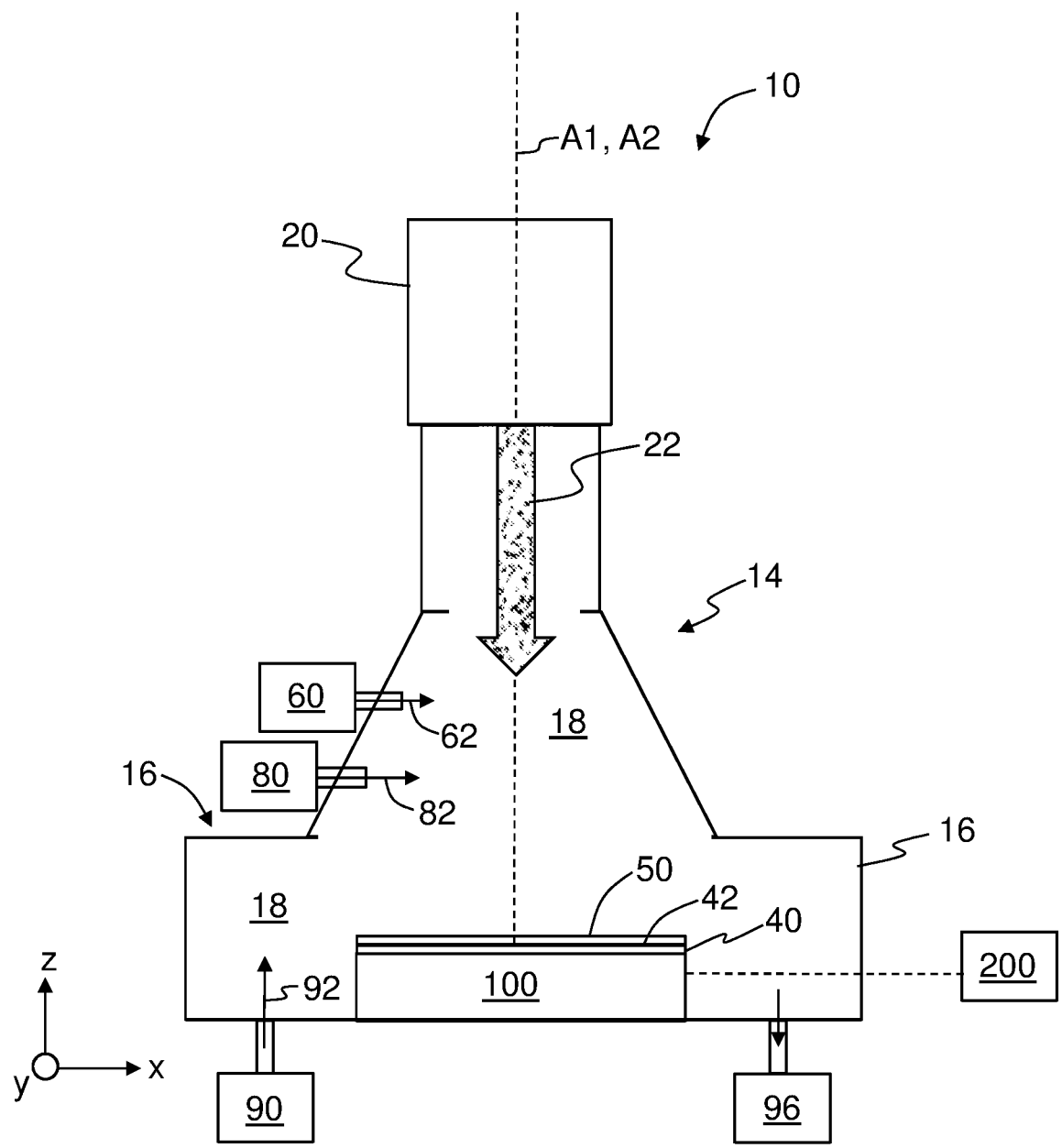
FIG. 1 is a schematic diagram of an example atomic layer deposition (ALD) system configured to perform substrate-biased ALD.

Reference is now made in detail to various embodiments of the disclosure, examples of which are illustrated in the accompanying drawings. Whenever possible, the same or like reference numerals and symbols are used throughout the drawings to refer to the same or like parts. The drawings are not necessarily to scale, and one skilled in the art will recognize where the drawings have been simplified to illustrate the key aspects of the disclosure. In particular, the scale of the chuck system is exaggerated in the z-direction for ease of illustration and to better illustrate the key features of the chuck system and in particular the electrical isolating layer.

The claims as set forth below are incorporated into and constitute part of this Detailed Description.

ALD System

FIG. 1 is a schematic diagram of an example atomic layer deposition (ALD) system 10 that includes a chuck system 100 as disclosed herein and as described in greater detail below. The chuck system 100 is configured to support a substrate 40 having an upper surface 42. An example ALD system 10 is one of the Fiji series modular, high-vacuum plasma-based ALD systems available from Ultratech, Inc., Waltham, Mass. The chuck system can also be used in other types of ALD systems, e.g., non-plasma ALD systems. The chuck system 100 includes voltage source 200 that provides a bias voltage to the substrate 40 when performing an ALD process to deposit an electrically conductive film ("conductive film") 50 using the ALD system 10. Example conductive films include W, TiN, TaN, MoN, NbN, ZnO, as well as others. The ALD process that employs a voltage bias to the substrate 40 is referred to herein as "substrate-biased ALD" or "voltage-biased ALD."

The ALD system 10 includes a reactor chamber 14 having a central axis A1 that runs in the z-direction. The reactor chamber 14 is defined by at least one sidewall 16. The reactor chamber 14 includes a chamber interior ("interior") 18. The ALD system 10 can include a plasma source 20 that is operably arranged relative to the reactor chamber 14 and that forms a plasma 22.

The ALD system 10 also includes precursor gas sources 60 and 80 that are respectively configured to provide (e.g., introduce) precursor gases 62 and 82. In an example, the introduction of precursor gases 62 and 82 can be managed via the operation of a controller (not shown) or can also be accomplished manually. The ALD system 10 also includes an inert gas source 90 that provides an inert gas 92 (e.g. nitrogen, argon, etc.) to purge the interior 18.

The ALD system 10 also includes a vacuum system 96 to evacuate the interior 18 to initiate the ALD-based methods as well as to assist in removing excess precursor gases 62 and 82 during the various ALD steps.

Chuck System

Figure 2A:
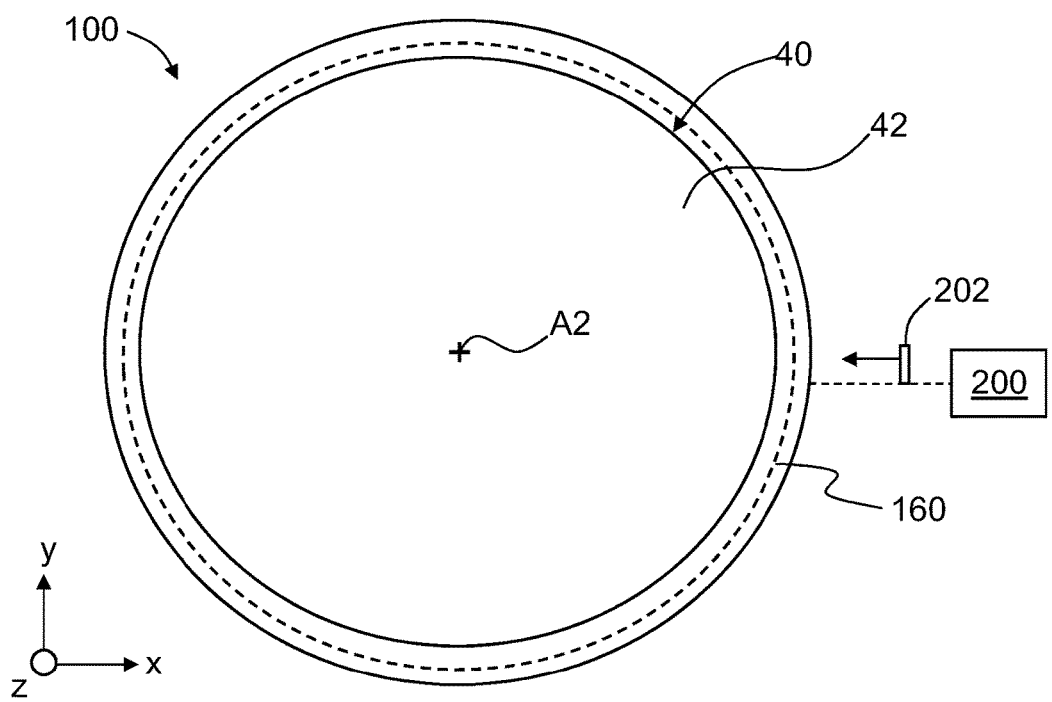
FIG. 2A is a top-down view of an example chuck system as disclosed herein.
Figure 2B:
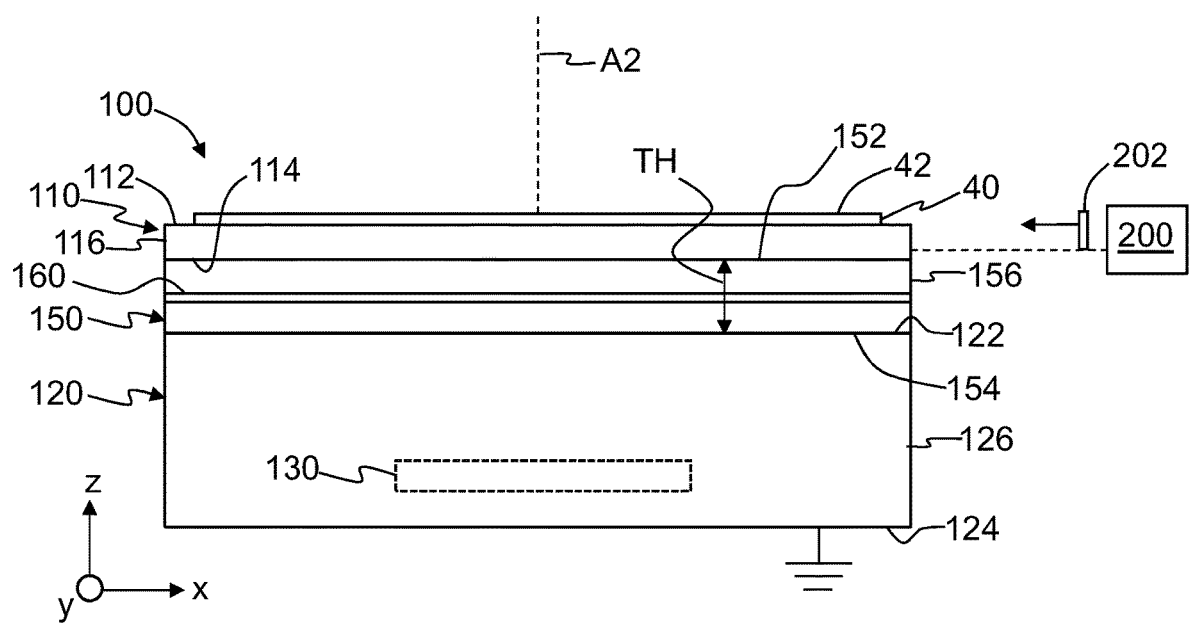
FIG. 2B is a side view of the example chuck system of FIG. 2A.

FIG. 2A is a top-down view and FIG. 2B is a side view of an example chuck system 100 according to the disclosure. The chuck system 100 includes a central axis A2 that runs along the z-direction and in an example is co-axial with the central axis A1 of reactor chamber 14.

In an example, the chuck system 100 includes a substrate holder 110 that has an upper surface 112, a lower surface 114 and an outer edge 116. The upper surface 112 of the substrate holder 110 is configured to support the substrate 40. The substrate holder 110 is made of an electrically conductive material (e.g., copper, stainless steel, etc.) and is electrically connected to the voltage source 200. The voltage source 200 provides a voltage signal 202 to the substrate holder 110 and thus to the substrate 40, thereby electrically biasing the substrate relative to ground.

For certain types of ALD reactions, the electrical bias of substrate 40 can be used to attract select ions in the precursor gas to enhance the ALD process (e.g., increase the deposition rate) and/or make changes to the film properties, such as changing the conductivity, changing the film density, changing internal film stress, or altering the super-conducting properties of the film. The substrate holder 110 is sized to operably support substrates of various sizes, including conventional semiconductor-wafer sizes of 100 mm or 200 mm or 300 mm or even larger. In an example, the substrate holder 110 can have a thickness of about 0.25" (6.4 mm).

The chuck system 100 also includes a base 120 having an upper surface 122, a lower surface 124 and an outer edge 126. The base 120 is typically made of an electrically conductive material. In an example, the base 120 includes a heater 130 for heating the base as well as the substrate holder 110 to heat the substrate 40 to an initial temperature suitable for the ALD process. The base 120 and reactor chamber 14 are electrically at ground. In an example, the base 120 can have a thickness in the range from 0.25" (6.4 mm) to 3"

(76.2 mm) and have a diameter that substantially matches that of the substrate holder 110. The base 120 can be made of copper, stainless steel or like conducting materials.

The chuck system 100 also includes an electrical isolating layer 150 sandwiched between the base 120 and the substrate holder 110 and that serves to electrically isolate the electrically conductive base from the electrically conductive substrate holder. The electrical isolating layer 150 has a body 151, an upper surface 152, a lower surface 154, and an outer edge 156. In an example, the electrical isolating layer 150 is planar and has a thickness TH and a diameter D. In an example, the thickness TH is in the range defined by 0.1" (2.5 mm)≤TH≤0.5" (12.7 mm).

Two main requirements for a material used to form electrical isolating layer 150 is that it be electrically insulating and be able to withstand the maximum temperature of the given ALD process, which typically can range from 25° C. to 500° C. Example materials for electrical isolating layer 150 include electrical insulating materials such as glass, ceramic, plastic, thermoplastic, polyamide (nylon), polyimide (Kapton), epoxy, polymer and polycarbonate. In an example, the electrical isolating layer 150 is in the form of a thin disc. In an example, the electrical isolating layer 150 is monolithic, i.e., formed as a single piece made of a single material. In other examples discussed below, the electrical isolating layer 150 is formed from two or more separate pieces, including pieces made of different materials.

Figure 3A:
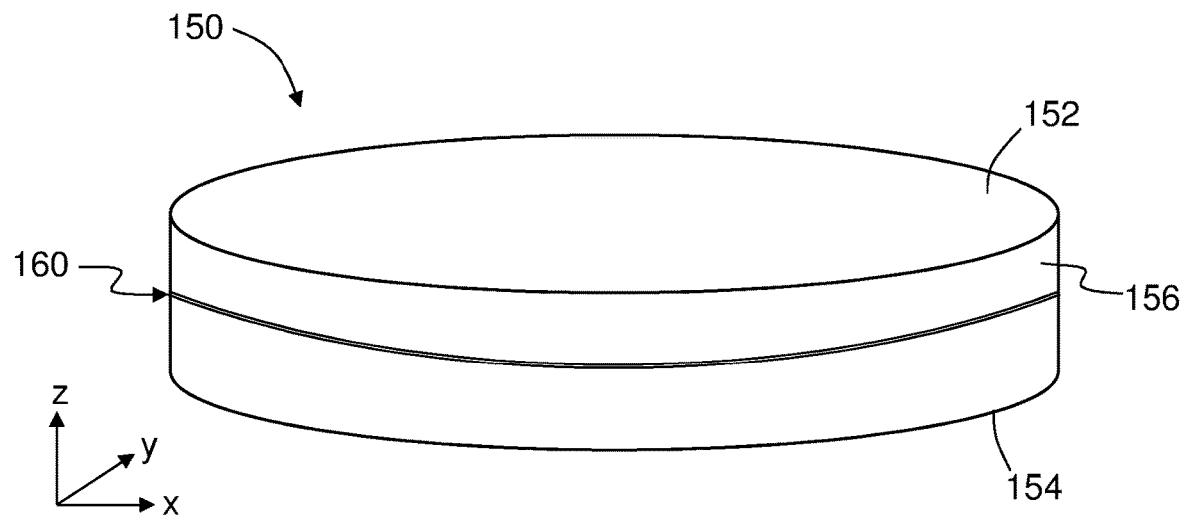
FIG. 3A is an elevated isometric view of an example electrical isolating layer according to the disclosure and as used in the chuck system of FIGS. 2A and 2B.
Figure 3B:
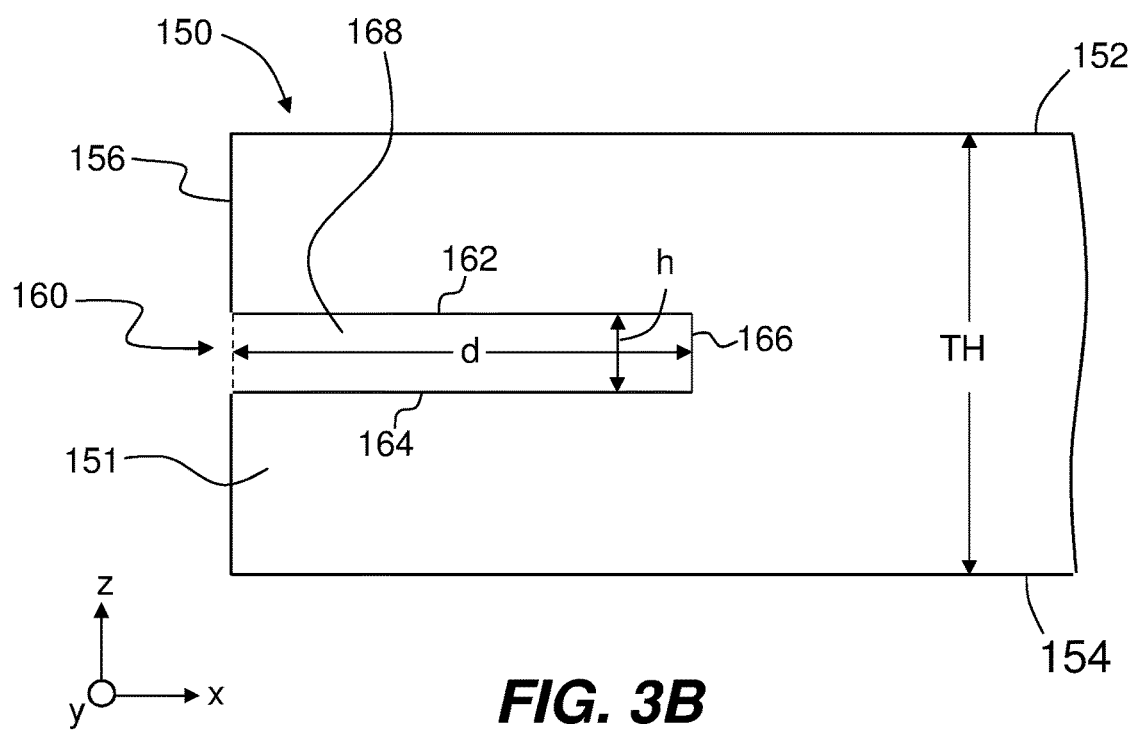
FIG. 3B is a close-up cross-sectional view of an edge portion of the electrical isolating layer illustrating an example cross-sectional configuration for the edge recess.

FIG. 3A is a top elevated view of an example electrical isolating layer 150 while FIG. 3B is a close-up cross-sectional view of an edge portion of the electrical isolating layer. The electrical isolating layer 150 includes at least one recess 160 formed in the outer edge 156 and so is referred to hereinafter as an "edge recess". In an example, the at least one edge recess 160 extends radially inward toward the central axis A2. In an example, the at least one edge recess 160 has a directional component that is radially inward toward central axis A2. The discussion below refers to a single edge recess 160 for ease of discussion and unless otherwise noted.

The edge recess 160 runs around the entire outer edge 156, as indicated by the dashed circle in FIG. 2A and as shown in FIG. 3A. As shown the close-up x-z cross-sectional view of FIG. 3B, in one example the edge recess 160 can have a rectangular cross-sectional shape. In an example, the edge recess 160 has an upper wall 162, a lower wall 164 and an end wall 166 that define a recess interior 167. The edge recess 160 has a depth dimension d measured radially inward from outer edge 156. The edge recess 160 also has height dimension h as measured in the z-direction. As discussed below, in other embodiments, depth and height dimensions (d,h) can vary with position, i.e., need not be constant. In such examples, the depth and height dimensions (d,h) can be considered minimum dimensions.

As noted above, the ALD process is highly conformal. The ALD process also ends up coating more than just the substrate upper surface 42. Thus, in practice, the ALD process will not only deposit the ALD film 50 on substrate upper surface 42 but will also coat the exposed upper surface 112 of the substrate holder 110, the outer edge 116 of the substrate holder, the outer edge 156 of the isolating layer 150 and the outer edge 126 of the base 120 with the ALD film 50. When the ALD film 50 is conducting, the ALD film can provide an electrical path between the conductive substrate holder 110 and conductive base 120 over the outer edge 156 of the isolating layer 150, thereby creating a short circuit, which is problematic for voltage-biased ALD applications.

Because the ALD process is conformal and can cover high-aspect-ratio features, the edge recess 160 needs to have a sufficiently high aspect ratio AR=d/h so that the ALD film cannot coat the entirety of the walls 162, 164, and 166 of the edge recess. If this occurs, then as noted above the conductive ALD film will be able to define an electrical path between the substrate holder 110 and the base 120 and create a short circuit around electrical isolating layer 150. Thus, in an example, the edge recess 160 has an aspect ratio of AR=d/h sufficiently large for the given ALD process to prevent the short circuit from forming.

The aspect ratio AR=d/h is most appropriate for a simple rectangular recess 160. More complex edge recesses can utilize an equivalent aspect ratio $AR_E$, which can be deduced empirically by simulations or experiments.

Figure 3C:
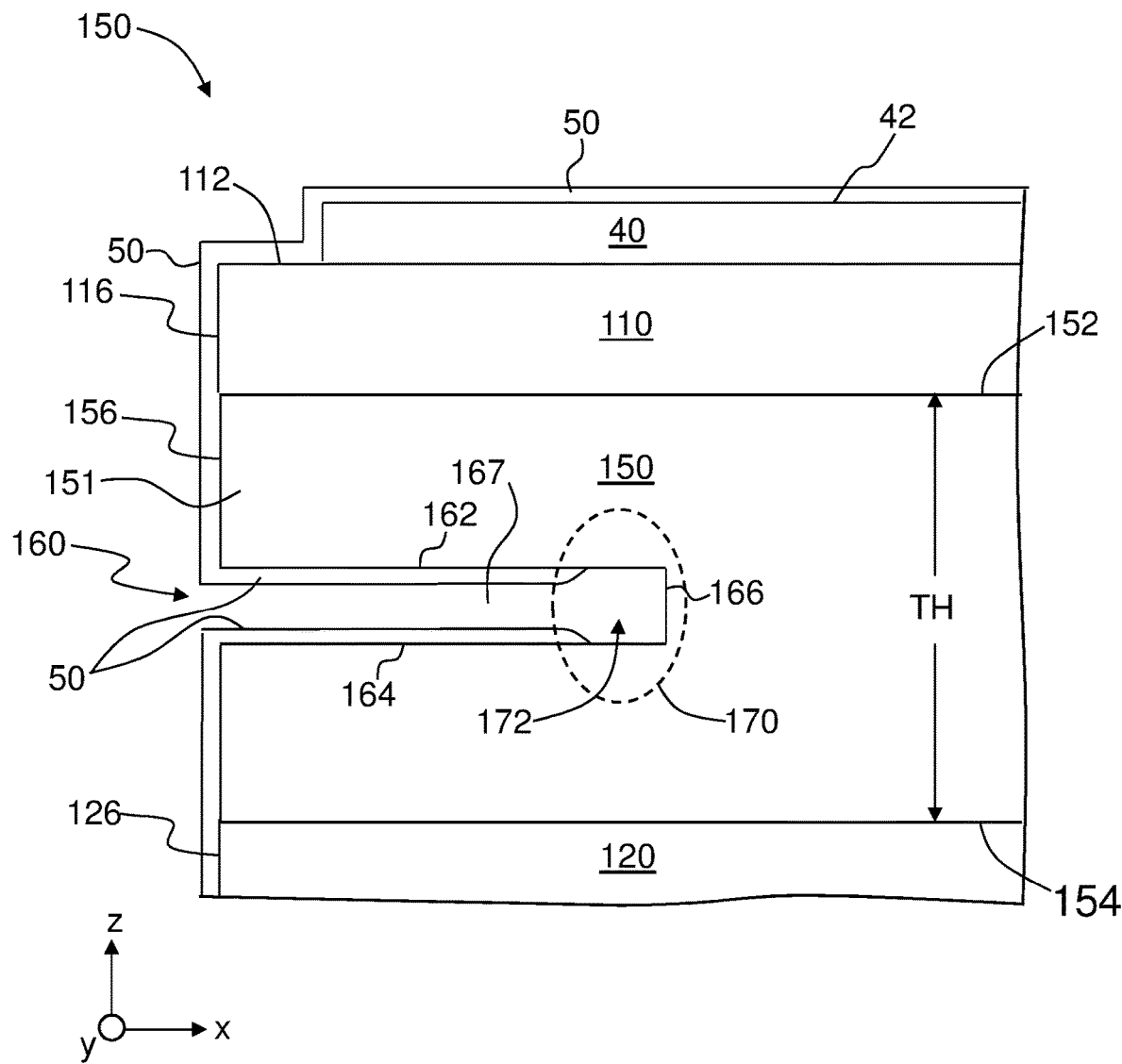
FIG. 3C is a close-up cross-sectional view of an edge portion of the chuck system illustrating how an electrically conductive ALD film coats the chuck system and how the edge recess in the isolating layer acts to form a break in the electrically conductive film to maintain the electrical isolation between the substrate holder and the chuck base.

FIG. 3C is similar to FIG. 3B and shows the effect of the edge recess 160 on the deposition process of a conductive ALD film 50 on chuck system 100. The conductive ALD film 50 (or its modified version) covers the exposed upper surface 112 of the substrate holder 110, the outer edge 116 of the substrate holder, the outer edge 156 of the isolating layer 150 and the outer edge 126 of the base 120. The conductive ALD film 50 will also attempt cover the interior 167 of the edge recess 160, i.e. cover the inside walls 162, 164, and 166. However, because the aspect ratio AR of the edge recess 160 is sufficiently large, the conductive ALD film 50 will only be able to extend part way into the recess interior 167 toward the end wall 166, leaving an uncoated portion 170 of the recess interior that defines a gap 172 in conductive ALD film 50. The gap 172 in the conductive ALD film 50 prevents the development of a short-circuit between the conductive support holder 110 and the conductive base 120 through or over the isolating layer 150.

Experiments have shown that a suitable aspect ratio AR for most ALD processes that form conductive films 50 is AR≥50. For certain films, an aspect ratio of AR≥20 is suitable. In other example, the aspect ratio can be set to AR≥100. Thus, in various embodiments, the aspect ratio can be in the range from 20≤AR≤100 or 50≤AR≤100.

In an example, the height h is in the range 0.01" (0.25 mm)≤h≤0.05" (1.27 mm) while the depth d is in the range 0.20" (5.1 mm)≤d≤6" (152.4 mm) or 0.20" (5.1 mm)≤d≤4" (101.6 mm) or 0.20" (5.1 mm)≤d≤1" (25.4 mm). Thus, in one example, h=0.01" (2.5 mm) and d=50 h=0.5" (12.7 mm).

The upper limit of the aspect ratio AR can be constrained at least in part by the impact of the edge recess 160 on the transmission of heat from the base 120 to the substrate holder 110 through the electrical isolation layer 150. It is typically preferred that the substrate 40 have a substantially uniform temperature, e.g., to within a 5% variation or more preferably to within a 2% variation or within a 1% variation. It is believed that this temperature uniformity requirement does not greatly constrain the size and shape of the edge recess 160.

The upper limit of the aspect ratio AR can also be constrained at least in part by the physical stability of the substrate holder 110 when the depth d of edge recess 160 is very large. In addition, the upper limit of the aspect ratio AR can be limited by the technical ability (i.e., manufacturing limitations) to make the edge recess 160 very thin (small h) without the upper and lower walls touching.

Figure 4A:
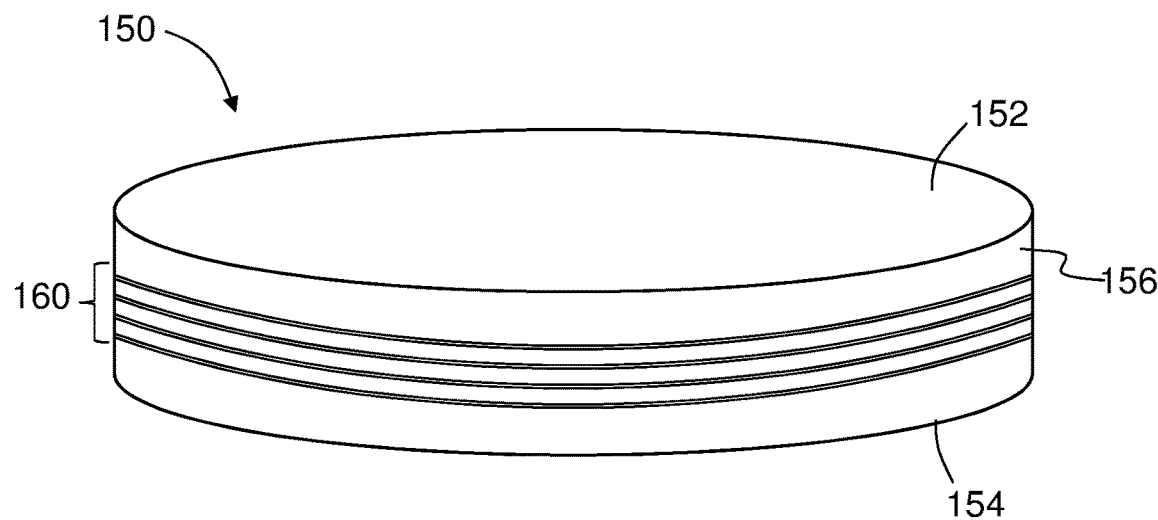
FIGS. 4A and 4B are similar to FIGS. 3A and 3B and illustrate an example embodiment of the electrical isolating layer that includes multiple edge recesses.
Figure 4B:
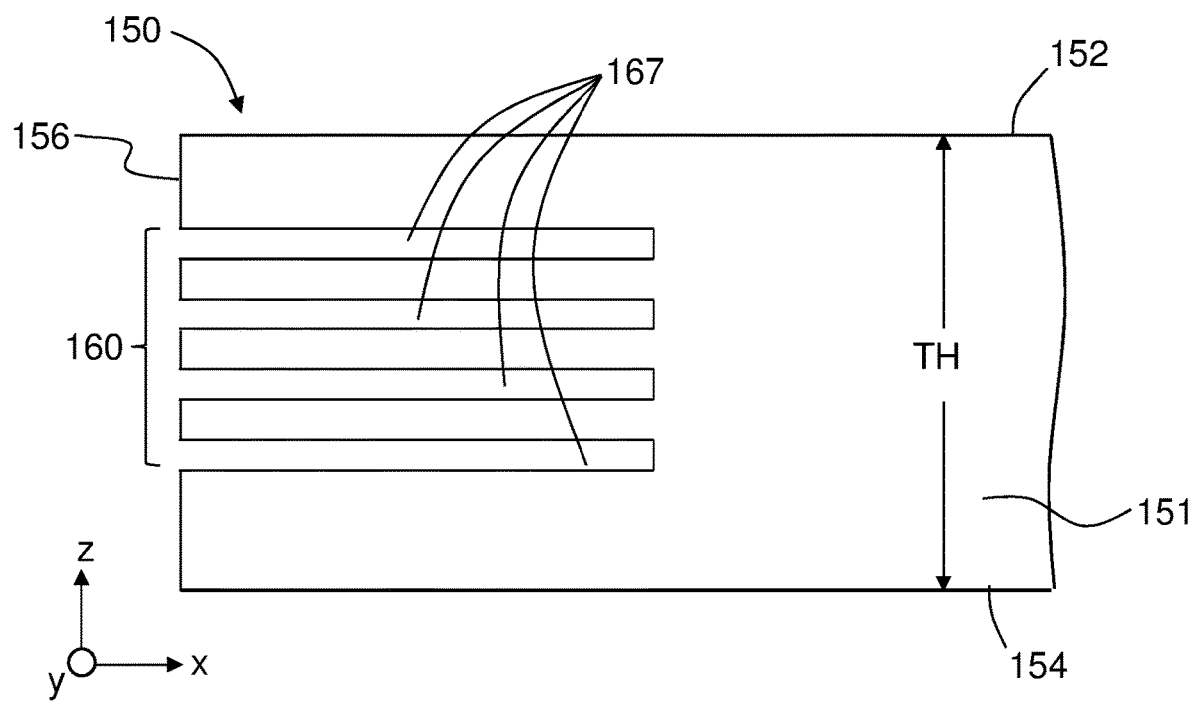

FIGS. 4A and 4B illustrate are similar to FIGS. 3A and 3B and illustrate an example embodiment wherein the isolating layer 150 includes multiple edge recesses 160, with four such edge recesses shown by way of example. The use of multiple edge recesses 160' provides electrical isolation redundancy.

Figure 5A:
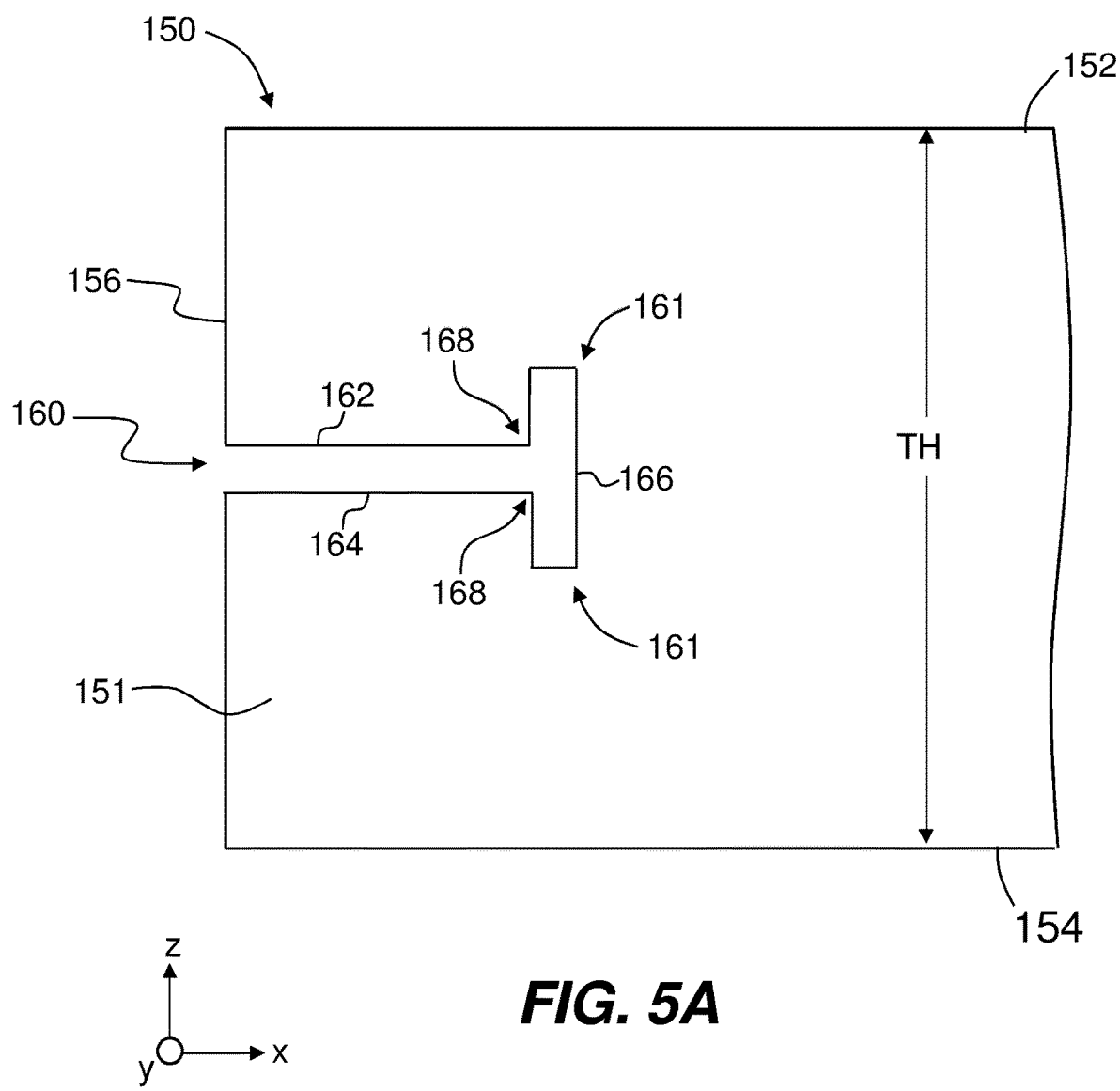
FIG. 5A through FIG. 5D are similar to FIG. 3B and illustrate other example configurations of an edge recess formed in the electrical isolating layer.
Figure 5B:
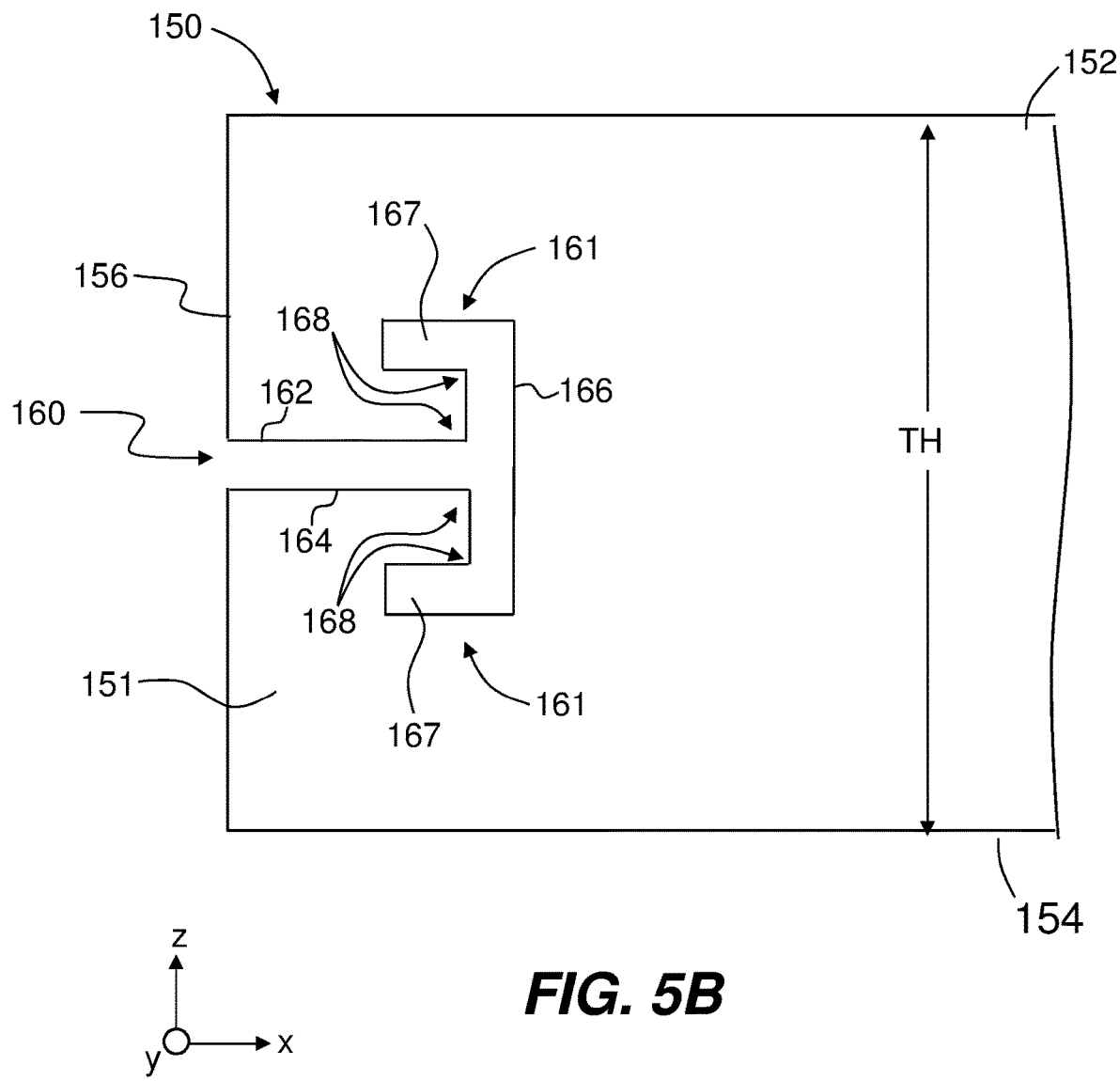
Figure 5C:
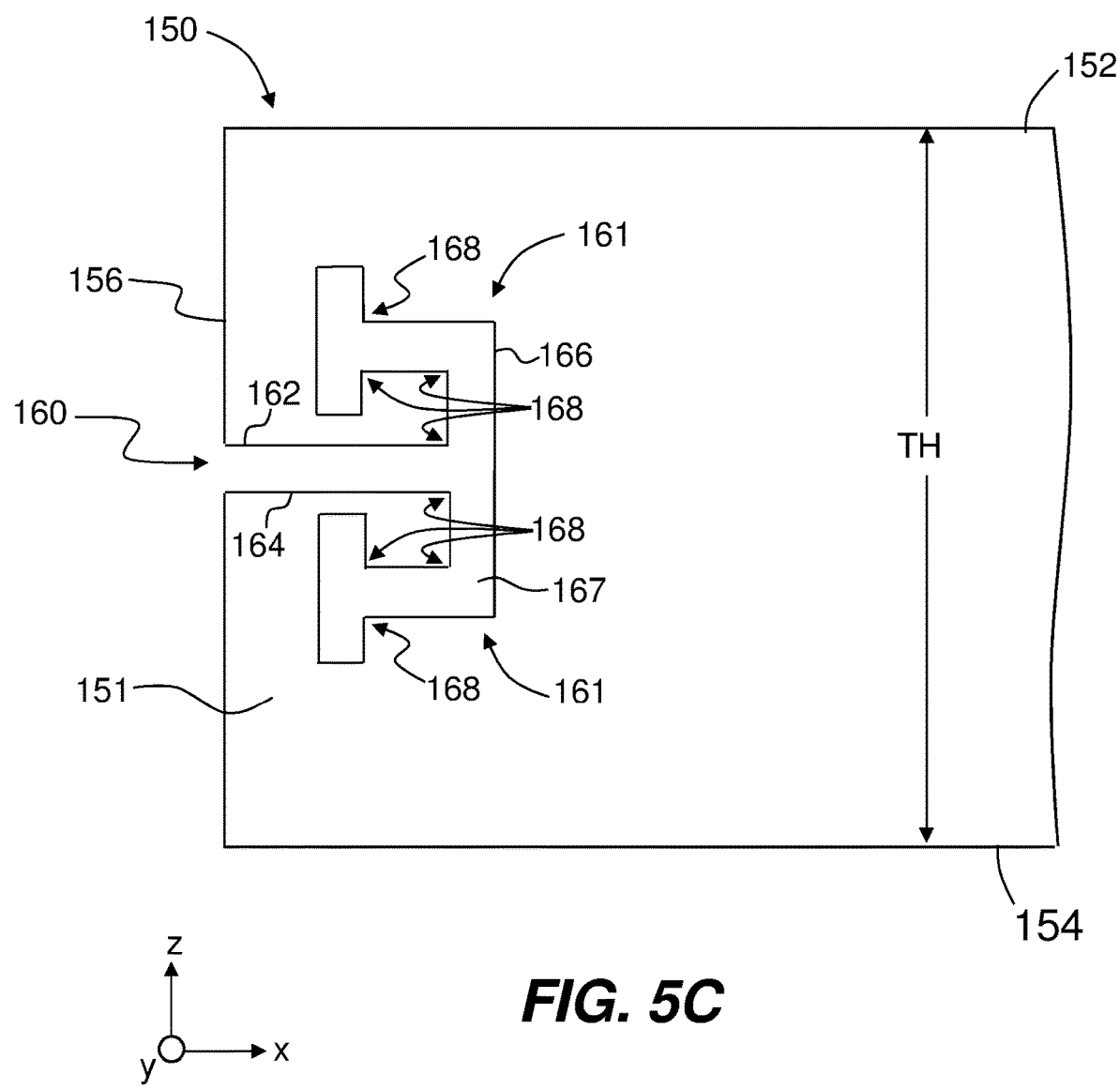

FIG. 5A through FIG. 5D are similar to FIG. 3B and illustrate other example configurations of the edge recess 160 formed in the electrical isolating layer 150. FIG. 5A shows an example configuration for the edge recess 160 that has a "T" shape in a cross-section taken radially relative to the electrically isolating layer that makes it even more difficult for the conductive ALD film 50 to deposit within the edge recess because the ALD deposition has to traverse two corners 168 and enter two different branches 61 of the edge recess 160. FIGS. 5B and 5C is similar to FIG. 5A and shows two complex configuration of the edge recess 160, respectively, that each include additional corners 168 that define additional branches 161 that make it increasingly difficult for the conductive ALD film 50 to deposit deep within the interior 167 of the respective edge recess.

Figure 5D:
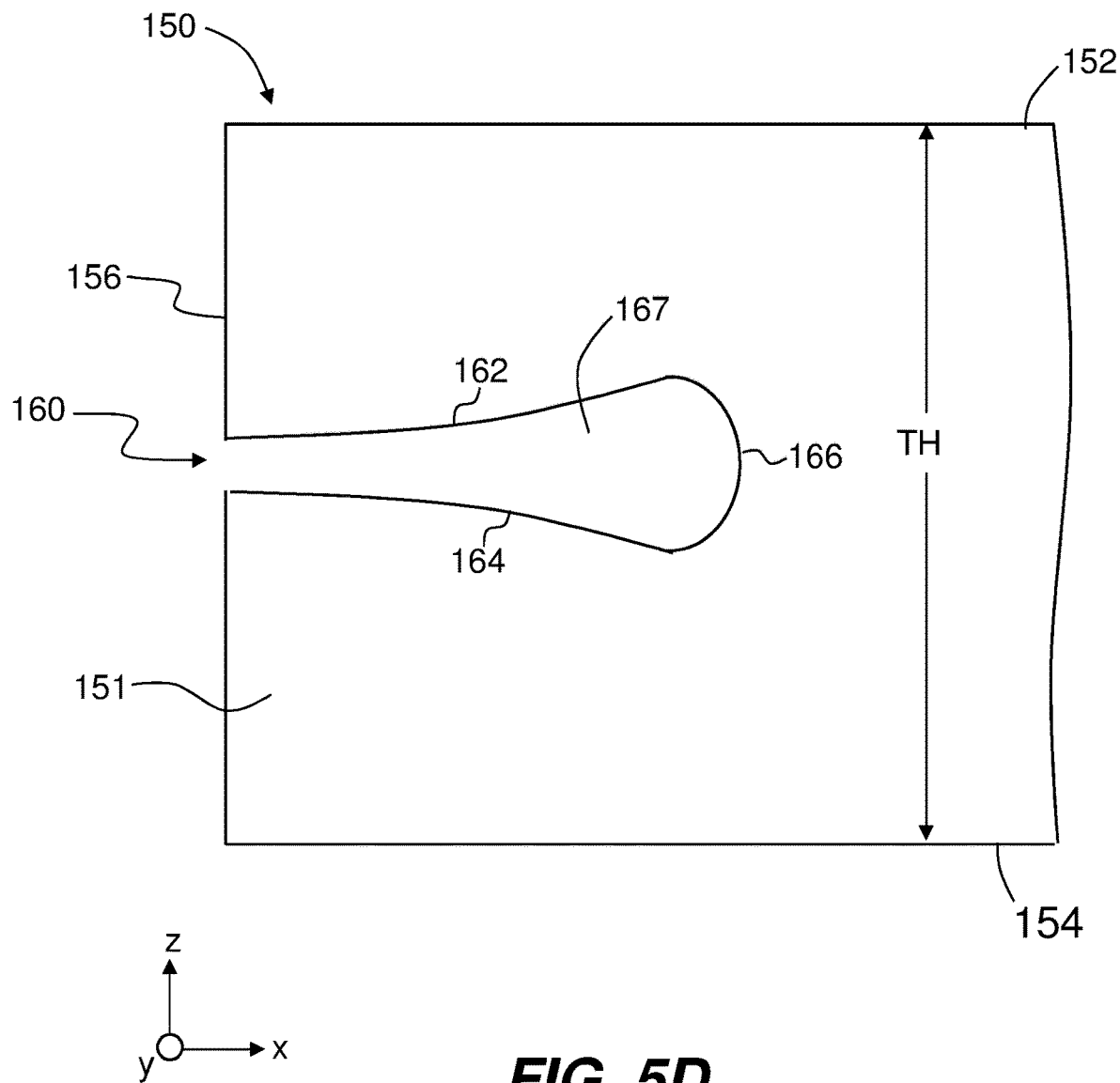

FIG. 5D illustrates an example edge recess 160 that includes curved upper and lower walls 162 and a curved end wall 166.

Generally speaking, the cross-sectional shape of edge recess 160 can have any reasonable configuration. In an example, electrical isolating layer 150 is formed using a three-dimension (3D) printing processes using conventional 3D printing technology. Present-day 3D printing technology is capable of defining extremely intricate and labyrinthian configurations for the edge recesses 160, e.g., configurations that include multiple branches 161. In an examples where conventional milling techniques are employed to form edge recess 160, it may be preferable to use a simple edge recess configuration, such as the rectangular cross-sectional shape of FIG. 3B.

Figure 6:
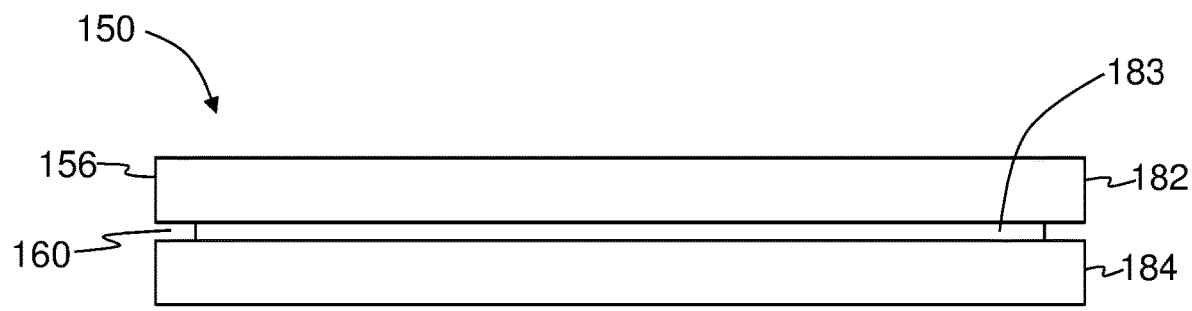
FIG. 6 is a side view of an example electrical isolating layer formed from three pieces arranged in a layered configuration.

FIG. 6 is a side view of an example electrical isolating layer 150 that is made of three separate pieces, namely an upper piece 182, a lower piece 184, and a middle piece 183 sandwiched by the upper and lower pieces. In an example, at least the middle piece 183 is made of an electrically insulating material. The edge recess 160 can be defined by making the middle piece 183 smaller (i.e., having a smaller diameter) than the upper and lower pieces 182 and 184. In an example, the upper and lower pieces need not be electrically insulating, e.g., can be made of aluminum or stainless steel. In an example, the upper, middle and lower pieces are secured to form a laminated structure using an adhesive that is resistant to high temperature. In another example, the upper, middle and lower pieces can be secured using screws or other fastening means.

Figure 7A:
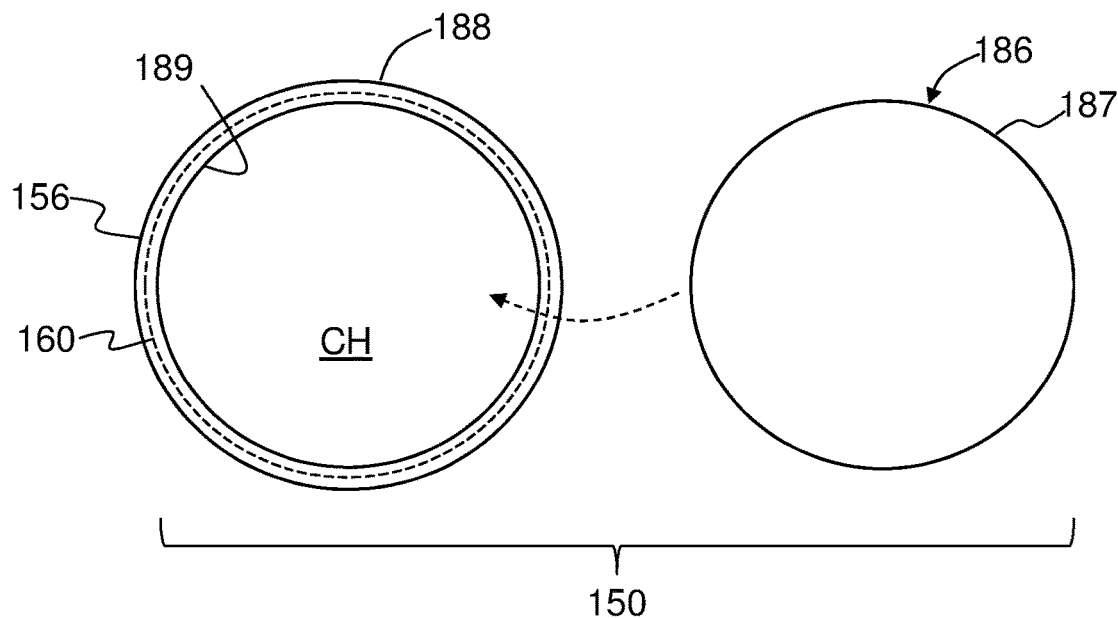
FIG. 7A is a top-down view of an example electrical isolating layer formed from two pieces, namely an annular outer piece and a center piece, showing the pieces side by side.

FIG. 7A is a top-down view of another example of electrical isolating layer 150 that is made of up two main pieces, namely a center piece 186 having a perimeter 187 and an annular outer piece 188 that has an inside edge 189. The inside edge 189 defines a center opening CH sized to closely accommodate the center piece 186, with the perimeter 187 of the center piece 186 disposed proximate (e.g., in contact with) the inside edge 189 of the annular outer piece 188.

Figure 7B:
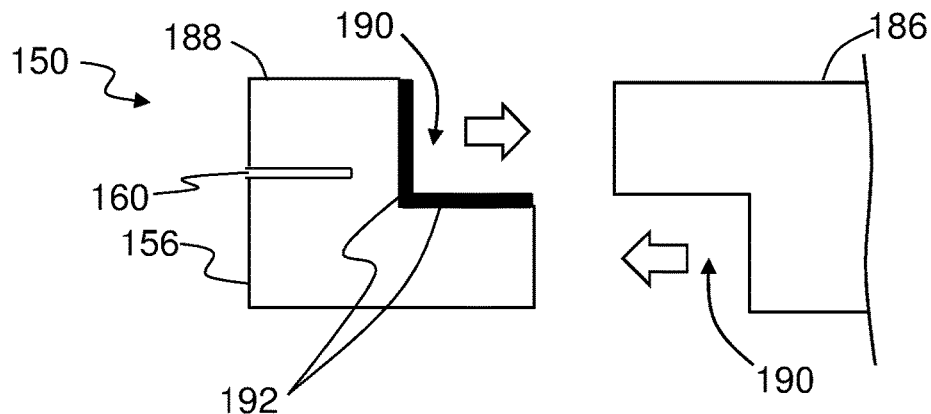
FIG. 7B is a close-up cross-sectional view of the annular outer piece and an edge portion of the center piece.

The annular outer piece 188 is made of an insulating material and includes an inner edge 189 and also defines the outer edge 156 in which the edge recess 160 is formed. In an example, the center piece 186 can be a disc made of an electrically conducting material such as aluminum or stainless steel. The center piece 186 can also be made of an insulating material. With reference to the close-up cross-sectional view of FIG. 7B, the annular outer piece 188 and the center piece 186 can include complementary engagement features 190 that facilitate engaging and securing the pieces to one another, e.g., via an adhesive 192.

Figure 8:
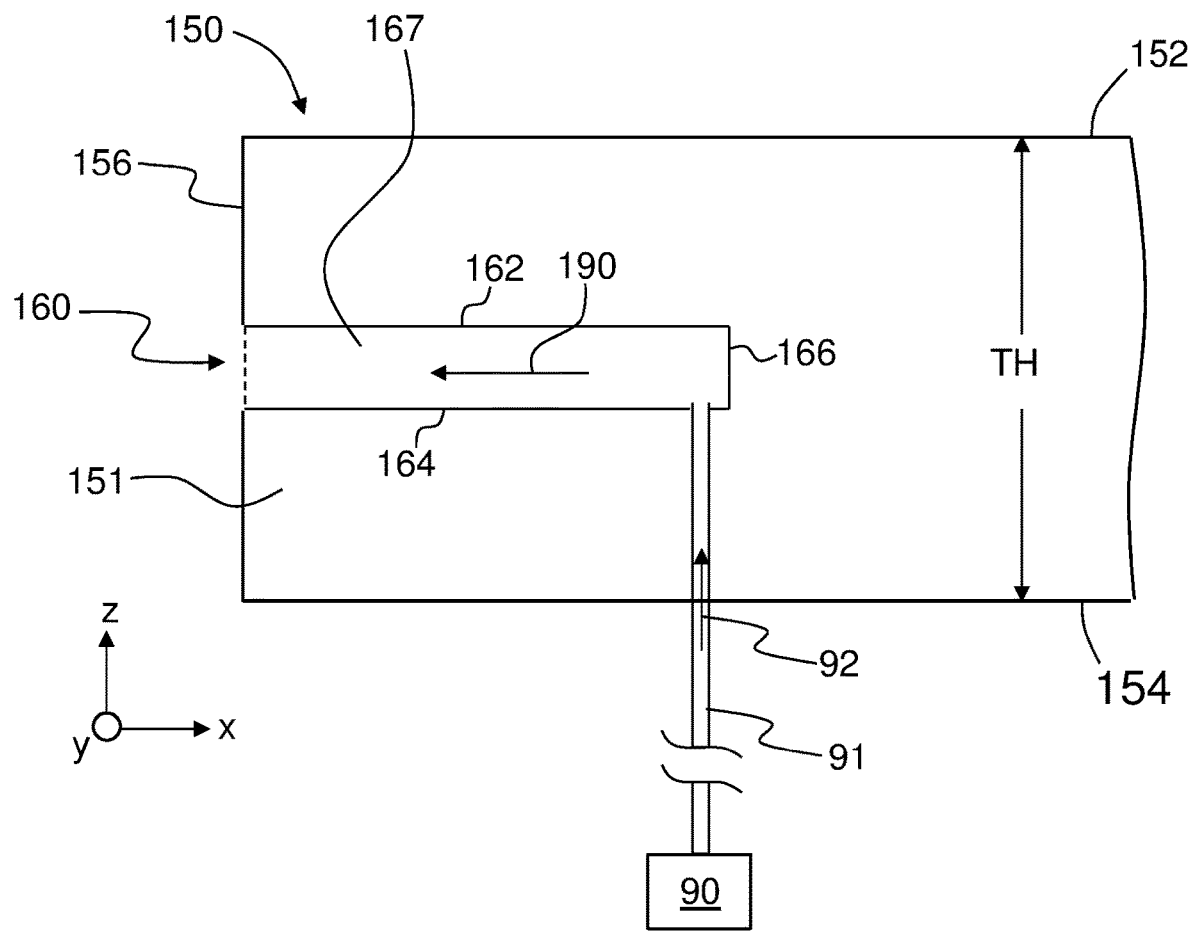
FIG. 8 is similar to FIG. 3 and illustrates an example embodiment wherein the edge recess is pneumatically coupled to a source of inert gas so that an inert gas can flow radially outward from the edge recess.

FIG. 8 is similar to FIG. 3 and shows an embodiment of the electrical isolating layer 150 wherein the edge recess 160 is pneumatically connected to the inert gas source 90 via a gas line 91. The gas line 91 supports the flow of inert gas 92 into the edge recess 160, e.g., at or near end wall 166. Due to the vacuum in the interior 18 of the reactor chamber 14, the inert gas 92 flows into the recess interior 167 and then radially outward until it exits the edge recess 160 at edge 156. This flow of inert gas 92 substantially prevents the ALD gases from entering the edge recess and depositing on the walls therein. In this "pressurized" embodiment of electrical isolating layer 150, the edge recess 160 can have an aspect ratio AR smaller than the "non-pressurized" embodiment.

Example ALD Process

An aspect of the disclosure is an ALD process for forming the conductive film 50 using the ALD system 10 and the chuck system 100 as shown in FIG. 1. The ALD process includes operably supporting the substrate 40 on the substrate holder 110 of chuck system 100 within reactor chamber 14 and then pulling a vacuum. The method can include heating the substrate 40 to an initial processing temperature using heater 130. Example initial temperatures can be in the range from 25° C. to 500° C.

A bias voltage is then applied to the substrate holder 100 via the bias voltage signal 202 from voltage source 200. Example bias voltages could be DC, −100V to +100V or an RF AC voltage. The RF voltage can have a frequency range of 10 Kilohertz to 100 Megahertz. The peak-to-peak voltage of the RF signal is determined by the power setting (0 watts to 300 watts), and can range from 0 watts to 600 watts. The bias voltage is set to just under half of the peak to peak voltage.

The method then includes introducing the first precursor gas 62 into chamber interior 18, wherein the first precursor gas includes a metal M. Metal-containing precursor gases for ALD are well known in the art and can include metals such as tungsten or titanium for example. The metal M in the first precursor gas attaches to the substrate upper surface 42, i.e., the metal M is chemisorbed with the preexisting chemical moieties on the substrate surface.

The method then includes purging the first precursor gas from the chamber interior 18 using the purge gas 92. The method then includes introducing the second precursor gas 82 into the chamber interior that reacts with the chemisorbed metal on the substrate surface 42 to form a first atomic layer of conductive film 50. The above process is then repeated to build up the conductive film layer by layer. The process can also include the use of additional precursor gases (i.e., more than two precursor gases) and purge steps.

The method includes the conductive film 50 depositing on the outer edges of the chuck system, including the outer edge 156 of electrical insulating layer 150 and within only a portion of the interior of the edge recess 160, leaving an uncoated portion 170 in the edge recess that defines a gap 172 (see, e.g., FIG. 3C) in the conductive film. The gap 172 serves to maintain the electrical isolation between the substrate holder 110 and the base 120 during the ALD process.

In an example, the method can include flowing the purge gas 92 radially outward from the edge recess 160 to prevent the precursor gases 62 and 82 from entering the edge recess.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A chuck system for performing a substrate-biased atomic layer deposition (ALD) process that forms an electrically conductive film on a substrate, the chuck system comprising:
   an electrically conductive substrate holder configured to support the substrate;
   an electrically conductive base; and
   an electrical isolating layer sandwiched between the electrically conductive substrate holder and the electrically conductive base and having an outer edge, with at least one edge recess formed in the outer edge and that runs around the outer edge, the at least one edge recess having an interior and being sized to prevent the electrically conductive film from coating the entire interior of the at least one edge recess during the substrate-biased ALD process.

2. The chuck system according to claim 1, wherein the at least one edge recess has a height dimension h defined by the range 0.01" (0.25 mm)≤h≤0.05" (1.27 mm).

3. The chuck system according to claim 1, wherein the at least edge one recess has a depth dimension d defined by the range 0.20" (5.1 mm)≤d≤4" (101.6 mm).

4. The chuck system according to claim 1, wherein the at least one edge recess has an aspect ratio AR≥20.

5. The chuck system according to claim 1, wherein the at least one edge recess has an aspect ratio AR defined by the range 50≤AR≤100.

6. The chuck system according to claim 1, wherein the at least one edge recess has rectangular cross-sectional shape.

7. The chuck system according to claim 1, wherein the electrical isolation layer has a thickness TH defined by the range 0.1" (2.5 mm)≤TH≤0.5" (12.7 mm).

8. The chuck system according to claim 1, wherein the electrical isolation layer is monolithic and made of a single electrically insulating material.

9. The chuck system according to claim 1, wherein the at least one edge recess includes at least one branch.

10. The chuck system according to claim 1, wherein the electrical isolating layer is formed from first and second pieces made of different materials, wherein at least one of the different materials is an electrically insulating material.

11. The chuck system according to claim 1, wherein the electrical isolating layer is formed at least first, second and third pieces, wherein at least one of the pieces is made of an electrically insulating material.

12. The chuck system according to claim 1, wherein the electrical isolating layer is made of at least one material selected from the group of materials comprising: glass, ceramic, plastic, thermoplastic, polyamide (nylon), polyimide (Kapton), epoxy, polymer and polycarbonate.

13. The chuck system according to claim 1, wherein the at least one edge recess comprises multiple edge recesses.

14. The chuck system according to claim 1, further comprising:
   a source of inert gas; and
   a gas line that pneumatically connects the source of inert gas to the interior of at least one edge recess.

15. An atomic layer deposition (ALD) system comprising:
   the chuck system according to claim 1; and
   a reactor chamber having an interior, wherein the chuck system is arranged in the reactor chamber interior.

* * * * *